(12) United States Patent
Kita

(10) Patent No.: US 8,791,369 B2
(45) Date of Patent: Jul. 29, 2014

(54) ELECTRONIC COMPONENT

(75) Inventor: Terumichi Kita, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 45 days.

(21) Appl. No.: 13/358,555

(22) Filed: Jan. 26, 2012

(65) Prior Publication Data

US 2012/0125675 A1 May 24, 2012

Related U.S. Application Data

(63) Continuation of application No. PCT/JP2010/061838, filed on Jul. 13, 2010.

(30) Foreign Application Priority Data

Jul. 28, 2009 (JP) .................................. 2009-174870

(51) Int. Cl.
*H05K 1/16* (2006.01)

(52) U.S. Cl.
USPC .......................................... 174/260; 174/262

(58) Field of Classification Search
USPC ........... 174/260–266; 361/794, 792, 793, 795
See application file for complete search history.

(56) References Cited

U.S. PATENT DOCUMENTS

| 7,868,257 B2 * | 1/2011 | Kushta et al. ................. 174/262 |
| 2008/0229822 A1 * | 9/2008 | Kato .......................... 73/504.12 |

FOREIGN PATENT DOCUMENTS

| JP | 2002-134639 A | 5/2002 |
| JP | 2005-277075 A | 10/2005 |
| WO | 2005/098359 A1 | 10/2005 |

OTHER PUBLICATIONS

Official Communication issued in International Patent Application No. PCT/JP2010/061838, mailed on Aug. 10, 2010.

* cited by examiner

*Primary Examiner* — Jeremy C Norris
(74) *Attorney, Agent, or Firm* — Keating & Bennett, LLP

(57) ABSTRACT

An electronic component that can be mounted with good balance includes a substrate, a plurality of first terminals located on a peripheral portion of one main surface of the substrate, a ground electrode located in a center of the one main surface of the substrate and including openings, and at least two second terminals located on the one main surface of the substrate and within the openings of the ground electrode and that are electrically isolated from the ground electrode. The second terminals are arranged at positions that are point symmetrical about a center of the ground electrode.

11 Claims, 6 Drawing Sheets

ELECTRONIC COMPONENT

BACKGROUND OF THE INVENTION

1. Field of the Invention

The present invention relates to electronic components, and in more detail, to an electronic component that is mounted using terminals and ground electrodes located on one main surface of a substrate.

2. Description of the Related Art

Electronic components such as switch modules and wireless LAN modules mounted in cellular phones have a plurality of terminals, to be connected to a mounting board, formed in a predetermined pattern.

For example, as illustrated in an arrangement diagram of FIG. 9, a relatively large ground electrode 112a is formed in the center of the bottom surface of a high-frequency module 101 and relatively small signal terminals 110, bias terminals 111, and ground terminals 112b are formed in the peripheral portion. In addition, a signal terminal 110 and a bias terminal 111 are formed within a ground electrode 112a.

By forming terminals and ground terminals in this manner, signal terminals and bias terminals can be formed at positions of a layered substrate under the mounted components, whereby wiring using unnecessary inner layer circuit patterns is not required and deterioration of insertion loss and interference with other patterns are prevented. Further, since there are no restrictions on terminal arrangement, a reduction in the size of a module is realized (refer to Japanese Unexamined Patent Application Publication No. 2005-277075, for example).

Referring to FIG. 9, an opening is formed in the lower ground electrode and a signal electrode and a bias electrode are formed within the opening, but an opening is not formed in the upper ground electrode. Hence, although terminals are arranged with left-right symmetry, i.e., with line symmetry about a center line in the up-down direction, the terminals are not symmetrically arranged about a center line in the left-right direction.

All the terminals, i.e., signal terminals, bias terminals, and ground terminals, are used for connection to a mounting board. Hence, in the configuration in which a signal terminal and a bias terminal are arranged within the opening of the lower ground electrode, mounting strength is reduced in certain places due to an imbalance in the amount of solder. This may cause generation of mounting defects or variations in the electric characteristics due to an unstable ground potential.

SUMMARY OF THE INVENTION

Accordingly, preferred embodiments of the present invention provide an electronic component that can be mounted with good balance.

An electronic component according to a preferred embodiment of the present invention includes a substrate, a plurality of first terminals located on a peripheral portion of one main surface of the substrate, a ground electrode that is located in a center of the one main surface of the substrate and that includes an opening, and at least two second terminals that are located on the one main surface of the substrate and within the opening of the ground electrode and that are electrically isolated from the ground electrode. The second terminals are arranged at positions that are point symmetrical about a center of the ground electrode.

According to the above-described configuration, when the electronic component is mounted on a mounting board, the mounting strengths of the ground electrode and the second terminals can be substantially balanced with respect to the center of the ground electrode.

An electronic component according to another preferred embodiment of the present invention includes a substrate, a plurality of first terminals located on a peripheral portion of one main surface of the substrate, a ground electrode that is located in a center of the one main surface of the substrate and that includes cut out portions; and at least two second terminals that are located on the one main surface of the substrate and within the cut out portions of the ground electrode and that are electrically isolated from the ground electrode. The second terminals are arranged at positions that are point symmetrical about a center of the ground electrode.

According to the above-described configuration, when the electronic component is mounted on a mounting board, the mounting strengths of the ground electrode and the second terminals can be substantially balanced with respect to the center of the ground electrode.

Preferably, at least one of the second terminals is a signal terminal to which a signal is input. A circuit element arranged on another main surface of the substrate preferably is connected to the signal terminal through a via conductor extending through the substrate in a vertical direction.

In this case, the connection distance between the circuit element and the second terminal which is a signal terminal can be minimized and generation of an undesired component such as a stray inductance is prevented such that the electric characteristics of the circuit element and the electronic component are stabilized.

Preferably, the circuit element is an element that includes a semiconductor substrate and that includes a transmission terminal and/or transmission/reception shared terminal. The transmission terminal and/or transmission/reception shared terminal of the circuit element is connected to the signal terminal.

In this case, isolation between a terminal for transmission (transmission terminal and/or transmission/reception shared terminal) and a terminal for reception (reception terminal) is increased.

Preferably, the single opening of the ground electrode includes the center of the ground electrode and a plurality of the second terminal electrodes are arranged within the single opening of the ground electrode.

In other words, a single opening is provided in the center and a vicinity of the ground electrode, and a plurality of the second terminals are disposed within the single opening. In this case, compared with the case in which a plurality of openings are provided near the center of the ground electrode and the second electrodes are arranged within the respective openings, wide spaces can be provided between the ground electrode and the second terminals even when the second terminals are arranged close to one another. This prevents a case in which, when the electronic component is mounted on a mounting board using solder or the like, the second terminals are connected to the ground electrode by solder or the like, whereby a short circuit occurs.

Preferably, areas of the all of the second terminals are the same, for example. In this case, variations in mounting strength are further reduced by making the areas of the second terminals be the same.

Preferably, at least one slit is formed in the ground electrode. In this case, bending stress generated in the ground electrode when the electronic component is mounted is reduced, whereby warping of the substrate is prevented and reduced.

Preferably, the center of the ground electrode is the same as a center of the one main surface of the substrate. In this case, the electronic component can be mounted with better balance than when the center of the ground electrode is not the same as the center of the one main surface of the substrate.

According to various preferred embodiments of the present invention, electric components can be mounted with good balance.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention are described with reference to FIG. 1 to FIG. 8.

First Preferred Embodiment

Figure 1:
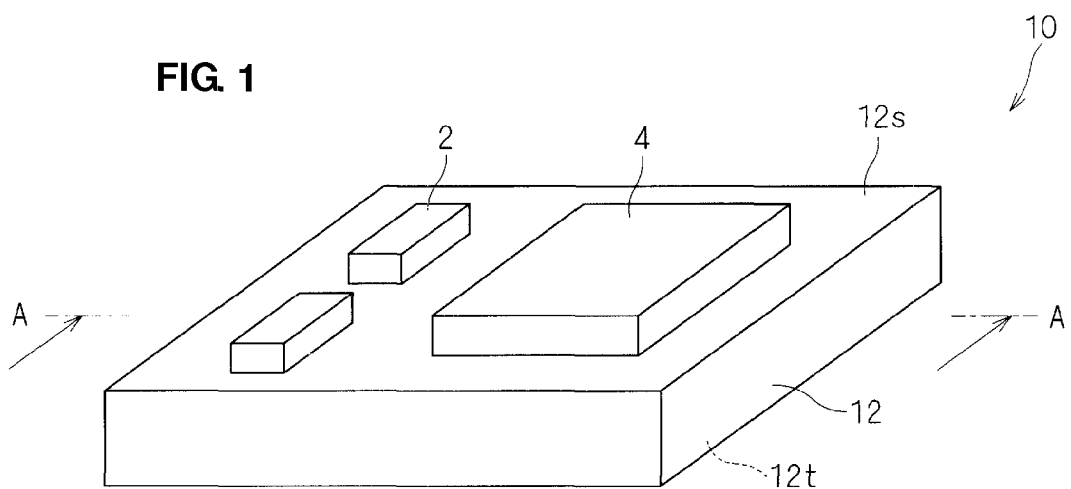
FIG. 1 is a perspective view of an electronic component according to a first preferred embodiment of the present invention.
Figure 2:
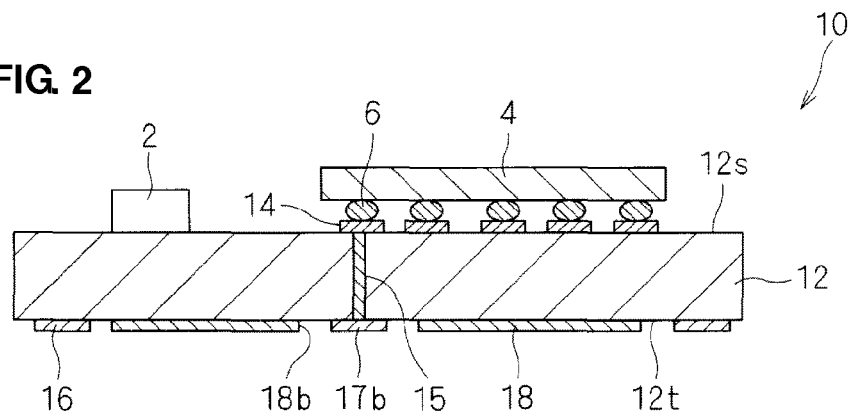
FIG. 2 is a cross-sectional view of an electronic component according to the first preferred embodiment of the present invention.
Figure 3:
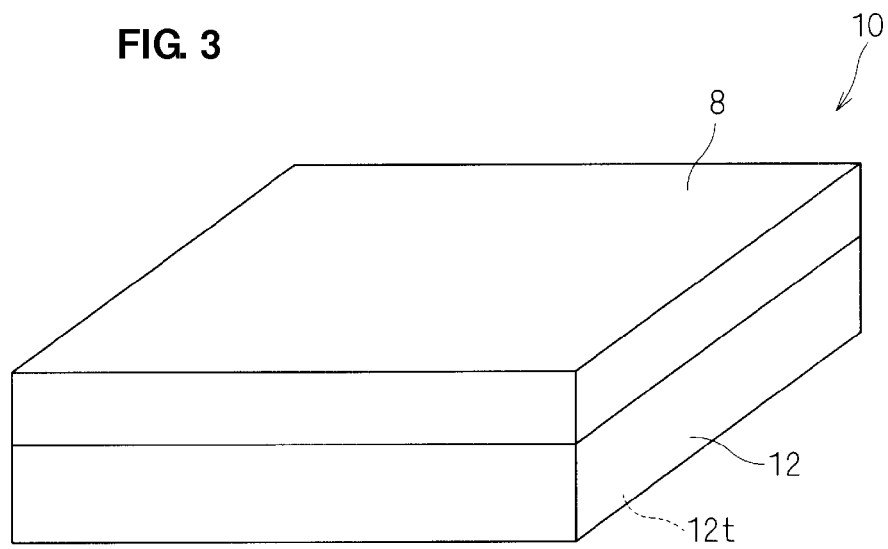
FIG. 3 is a perspective view of an electronic component according to the first preferred embodiment of the present invention.
Figure 4:
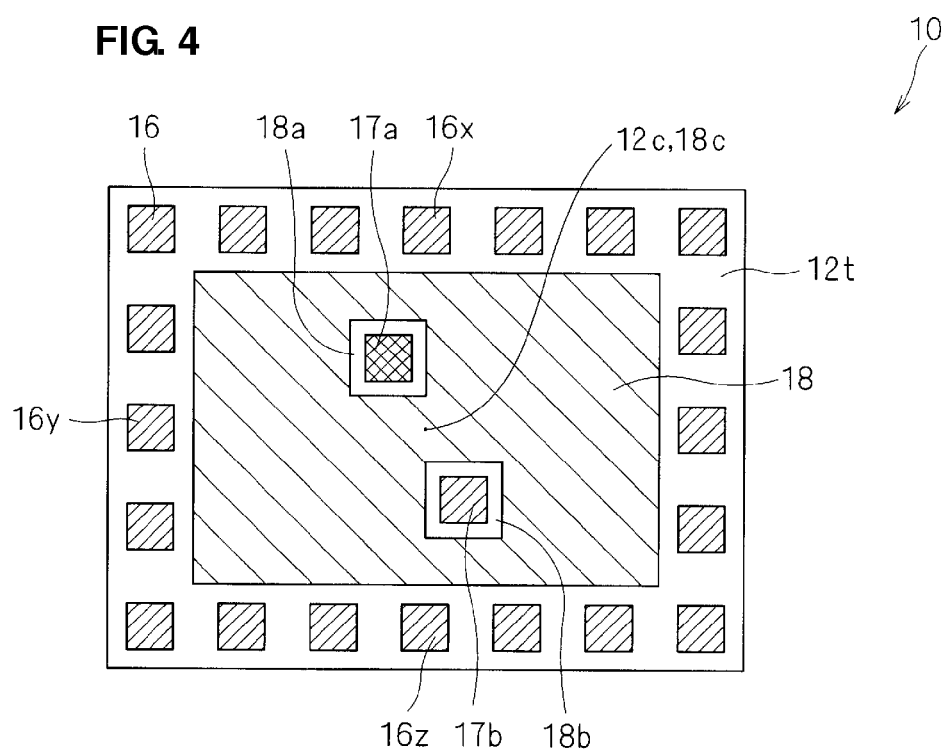
FIG. 4 is a bottom surface view of an electronic component according to the first preferred embodiment of the present invention.

An electronic component 10 according to a first preferred embodiment will be described with reference to FIG. 1 to FIG. 4. FIG. 1 and FIG. 3 are perspective views of the electronic component 10. FIG. 2 is a cross-sectional view taken along line A-A in FIG. 1. FIG. 4 is a bottom surface view of the electronic component 10.

Referring to FIG. 1 and FIG. 2, in the electronic component 10, circuit elements 2 and 4 are mounted on a top surface 12s of a substrate 12. Examples of the circuit elements 2 and 4 mounted on the top surface 12s of the substrate 12 include passive components, such as a chip capacitor and a chip coil, and a semiconductor device. When the substrate 12 is a multilayer substrate, wiring electrodes are preferably disposed on inner layers.

Referring to FIG. 3, the electronic component 10 includes a resin layer 8, if necessary, formed on the top surface 12s of the substrate 12 so as to cover the circuit elements 2 and 4. The circuit elements 2 and 4 may be covered by a cap-shaped member made of, for example, a metal, instead of the resin layer 8.

Referring to FIG. 4, on a bottom surface 12t of the substrate 12, a land gridd array (LGA) of electrodes is provided, and first terminals 16, second terminals 17a and 17b, and a ground electrode 18 are provided.

The first terminals 16 are located on the peripheral portion of the bottom surface 12t of the substrate 12. The first terminals 16 are signal terminals through which signals are input or output, except for some of them, i.e., the first terminals 16x, 16y, and 16z. The first terminals 16x, 16y, and 16z are ground electrodes to be grounded.

The ground electrode 18 is located in the center of the bottom surface 12t of the substrate 12. The ground electrode 18 includes two openings 18a and 18b disposed therein.

The second terminals 17a and 17b are located on respective portions of the bottom surface 12t of the substrate 12 exposed within the openings 18a and 18b of the ground electrode. The second terminals 17a and 17b are arranged at positions that are point symmetrical about a center 18c of the ground electrode 18. The cross-hatched second terminal 17a is an isolated terminal, which is electrically isolated from any of the first terminals 16, the other second terminal 17b, and the ground electrode 18, and is also electrically isolated from wiring electrodes disposed within the substrate 12 and the circuit elements 2 and 4 located on the top surface 12s of the substrate 12. The other second terminal 17b is a signal terminal.

With the configuration illustrated in FIG. 4, when the electronic component 10 is mounted on a mounting board (mother board) using solder, balance of the amounts of connection solder based on the difference in the ratios of the areas of the second terminals 17a and 17b to the ground electrode 18 becomes better, and a state is achieved in which the mounting strengths are approximately balanced with respect to the center 18c of the ground electrode 18, whereby the electronic component 10 can be mounted with good balance. Hence, better mountability (the inclination of the electronic component 10 with respect to the mounting board, or the balance of mounting strengths when viewed in the surface direction of the mounting board) after mounting is obtained.

Referring to FIG. 2, the circuit element 4 (for example, a semiconductor chip) mounted on the top surface 12s of the substrate 12 is flip-chip mounted using terminals 14 located on the top surface 12s of the substrate 12 and bumps 6. The terminal 14 connected to the circuit element 4 and the second terminal 17b, which is a signal terminal, are arranged such that at least portions thereof are superposed with each other when viewed in plan from the top surface 12s of the substrate 12, and are connected through a via conductor 15 extending through the substrate 12.

By connecting the terminal 14 and the second terminal 17b through the via conductor 15, the connection distance between the circuit element 4 and the second terminal 17b can be minimized and generation of an undesired component such as a stray inductance is prevented and suppressed, whereby the electric characteristics of the circuit element 4 and the electronic component 10 are stabilized.

When the electronic component 10 is a switch module, a Bluetooth module, or a wireless LAN module mounted in a cellular phone, the signal terminal of a semiconductor device (switch IC or RF-IC) mounted as the circuit element 4 is connected to the second terminal 17b through the via conductor 15. In this case, by particularly connecting an antenna terminal or a transmission terminal, to which a high-power signal is input during transmission, to the second terminal 17b surrounded by the ground electrode 18, interference with other terminals due to that signal is prevented.

In other words, a signal having a higher power than a reception side signal passes through a transmission terminal or a transmission/reception shared terminal (antenna terminal) during transmission. Hence, an electromagnetic field generated due to the high power is widely distributed around the transmission terminal or transmission/reception shared terminal. When another signal terminal such as a reception terminal is arranged in the vicinity of the transmission terminal or transmission/reception shared terminal where the electromagnetic field is widely distributed as described above, a signal from the transmission terminal or transmission/reception shared terminal penetrates into the reception terminal, whereby undesired interference such as generation of noise in a signal occurs. Hence, by connecting a terminal for transmission (transmission terminal and transmission/reception shared terminal) to the second terminal 17b surrounded by the ground electrode 18, the ground electrode 18 plays the role of a shielding electrode, whereby distribution of an electromagnetic field generated in the vicinity of the second terminal 17b, which is a terminal for transmission, is prevented and suppressed. As a result, isolation between a terminal for transmission and a terminal for reception is increased.

The substrate 12 of the electronic component 10 may be a multilayer substrate or a single layer substrate, and the material thereof may be a ceramic or a resin, for example. For example, in the case of a multilayer resin substrate (a so called printed wiring board), the terminals 14, 16, 17a, and 17b and the ground electrode 18 preferably are formed by forming Ni/Au plated films on the surfaces of Cu electrodes (Cu foils).

Note that the second terminals 17a and 17b can be formed to have different areas. However, when the second terminals 17a and 17b are formed to have the same area, the electronic component 10 can be mounted with better balance than when the second terminals 17a and 17b are formed to have different areas.

Further, the center 18c of the ground electrode 18 can be arranged so as not to be the same as a center 12c of the bottom surface 12t of the substrate 12. However, when the center 18c of the ground electrode 18 is the same as the center 12c of the bottom surface 12t of the substrate 12, the electronic component 10 can be mounted with better balance than when the center 18c of the ground electrode 18 is not the same as the center 12c of the bottom surface 12t of the substrate 12.

Further, the openings 18a and 18b can be formed in shapes that are not point symmetrical about the center 18c of the ground electrode 18. However, when the openings 18a and 18b are formed in shapes that are point symmetrical about the center 18c of the ground electrode 18, the electronic component 10 can be mounted with better balance than when the openings 18a and 18b are not formed in shapes that are point symmetrical about the center 18c of the ground electrode 18.

Second Preferred Embodiment

An electronic component 10a according to a second preferred embodiment will be described with reference to FIG. 5. The electronic component 10a preferably is configured to be approximately the same as the electronic component 10 of the first preferred embodiment. Hereinafter, constituent components that are the same as those in the first preferred embodiment are denoted by the same reference numerals, and differences from the first preferred embodiment are mainly described.

Figure 5:
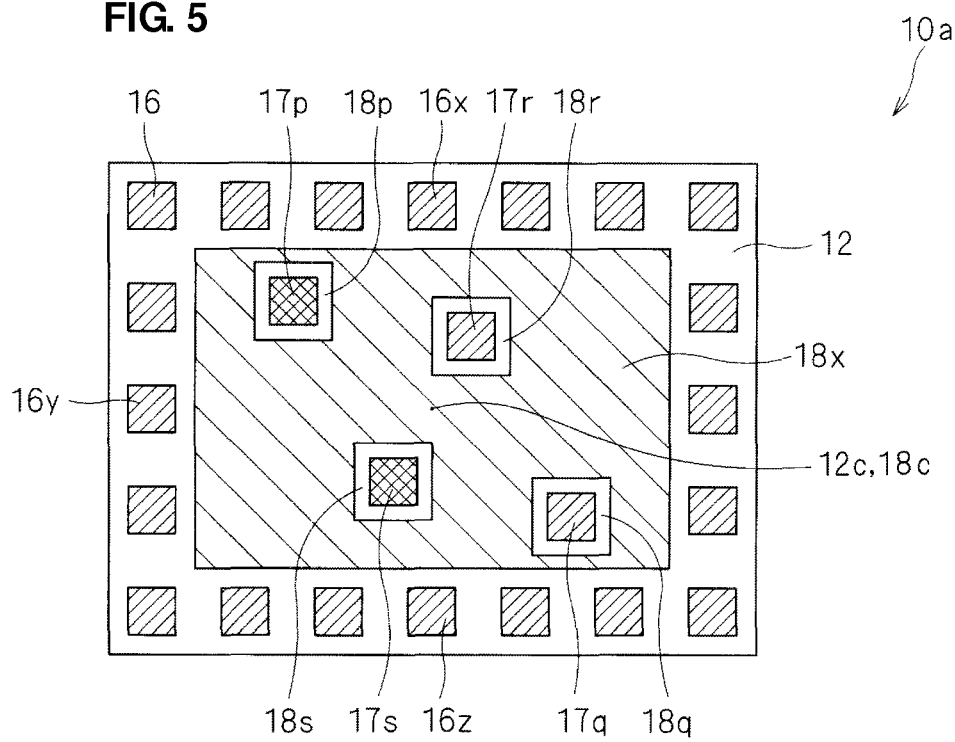
FIG. 5 is a bottom surface view of an electronic component according to a second preferred embodiment of the present invention.

FIG. 5 is a bottom surface diagram of the electronic component 10a of the second preferred embodiment. Referring to FIG. 5, in the electronic component 10a of the second preferred embodiment, the first terminals 16 are located on the peripheral portion of the bottom surface 12t of the substrate 12, and a ground electrode 18x is located in the center of the bottom surface 12t of the substrate 12, similarly to the first preferred embodiment.

Unlike the first preferred embodiment, the electronic component 10a of the second preferred embodiment includes four openings 18p, 18q, 18r, and 18s formed in the ground electrode 18x, and the openings 18p, 18q, 18r, and 18s respectively have second terminals 17p, 17q, 17r, and 17s disposed therein, i.e., one terminal per opening. The cross-hatched second terminals 17p and 17s are isolated terminals. The other second terminals 17q and 17r are signal terminals. The other second terminals 17q and 17r are connected to circuit elements mounted on the top surface of the substrate through via conductors similarly to the first preferred embodiment, although not illustrated.

The second terminals 17p, 17q, 17r, and 17s are divided into two groups. The second terminals 17p and 17q in a first group are located at positions that are point symmetrical about the center 18c of the ground electrode 18. The second terminals 17r and 17s in the second group are also located at positions that are point symmetrical about the center 18c of the ground electrode 18.

The electronic component 10a of the second preferred embodiment can be mounted with good balance similarly to the first preferred embodiment.

Third Preferred Embodiment

An electronic component 10b according to a third preferred embodiment will be described with reference to FIG. 6.

Figure 6:
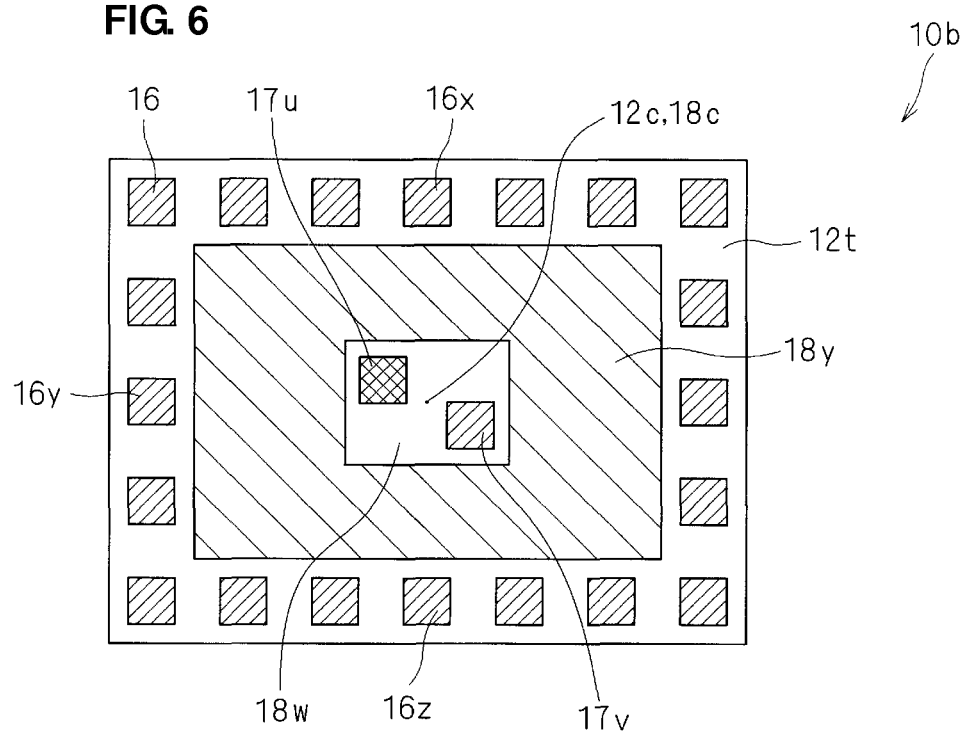
FIG. 6 is a bottom surface view of an electronic component according to a third preferred embodiment of the present invention.

FIG. 6 is a bottom surface diagram of the electronic component 10b of the third preferred embodiment. Referring to FIG. 6, in the electronic component 10b of the second preferred embodiment, the first terminals 16 are located on the peripheral portion of the bottom surface 12t of the substrate 12, and a ground electrode 18y is located in the center of the bottom surface 12t of the substrate 12, similarly to the first preferred embodiment.

Unlike the first preferred embodiment, in the electronic component 10b of the third preferred embodiment, a single opening 18w that includes the center 18c of the ground electrode 18 and the vicinity of the center 18c of the ground electrode 18 is located in the ground electrode 18y, and second terminals 17u and 17v are disposed within the opening 18w. The cross-hatched second terminal 17u is an isolated terminal. The other second terminal 17v is a signal terminal.

When the plurality of the second terminals 17u and 17v are disposed within the single opening 18w in this manner, a ground electrode need not be provided between the second terminals 17u and 17v even when the second terminals 17u and 17v are arranged close to each other, whereby wide spaces can be provided between the ground electrode 18y and the second terminals 17u and 17v. This prevents a case in which, when the electronic component 10b is mounted on a mounting board using solder or the like, the second terminals 17u and 17v are connected to the ground electrode 18y by solder or the like, whereby a short circuit occurs.

In other words, in the case in which the respective second terminal electrodes are disposed within a plurality of openings of the ground electrode as in the first preferred embodiment, since ground electrodes need to be located between the second terminals, spaces between the ground electrode and the second terminals need to be reduced when the second terminals are to be arranged close to one another. On the other hand, when a plurality of the second terminals are disposed within a single opening, spaces between the ground electrode and the second terminals need not be reduced even when the second terminals are arranged close to one another.

Fourth Preferred Embodiment

An electronic component 10c according to a third preferred embodiment will be described with reference to FIG. 7.

Figure 7:
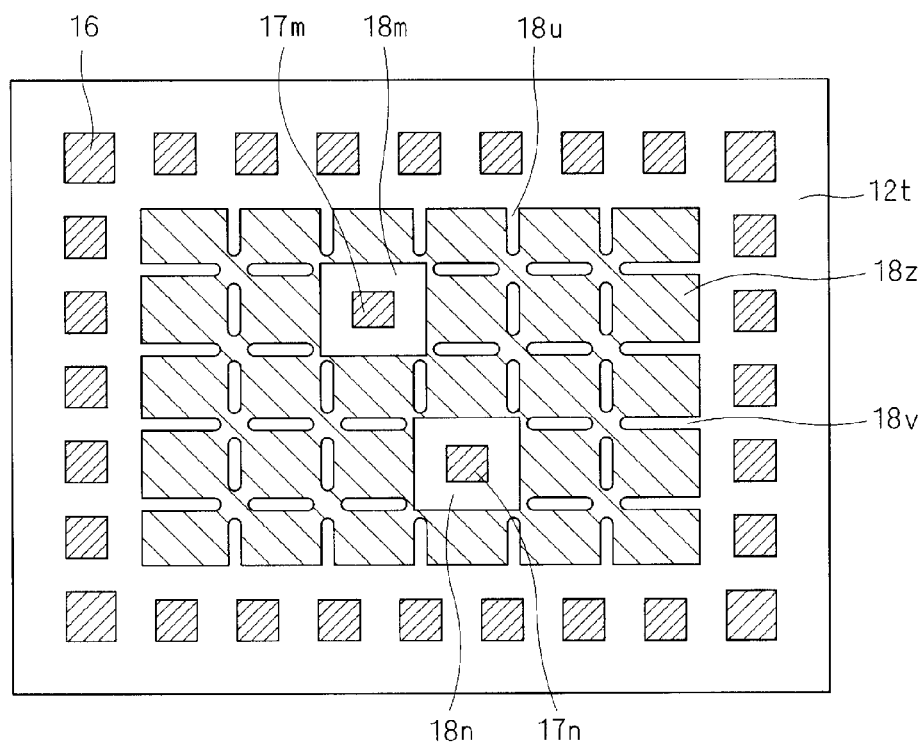
FIG. 7 is a bottom surface view of an electronic component according to a fourth preferred embodiment of the present invention.

FIG. 7 is a bottom surface diagram of the electronic component 10c of the fourth preferred embodiment. Referring to FIG. 7, in the electronic component 10c of the fourth preferred embodiment, the first terminals 16 are located on the peripheral portion of the bottom surface 12t of the substrate 12, and a ground electrode 18z is located in the center of the bottom surface 12t of the substrate 12, similarly to the first preferred embodiment. Second terminals 17m and 17n are respectively disposed within openings 18m and 18n located in the ground electrode 18z.

Unlike the first preferred embodiment, in the electronic component 10c of the fourth preferred embodiment, the ground electrode 18z includes slits 18u and 18v located therein respectively extending in the vertical and horizontal directions in the figure. The slits 18u and 18v preferably are discontinuously formed substantially in a lattice shape, for example. In other words, the slits 18u and 18v are arranged along virtual lattice lines that divide the ground electrode 18z except for in the vicinity of intersections of the virtual lattice lines.

By providing the slits 18u and 18v in the ground electrode 18z, bending stress generated in the ground electrode 18z when the electronic component 10c is mounted is reduced, whereby warping of the substrate is prevented and reduced.

Note that the slits may have any shape. For example, slits extending in a single direction or slits extending in an oblique direction may be used, for example. Slits extending in a zigzag pattern, in concentric circles, or in a spiral may be used, for example.

Fifth Preferred Embodiment

An electronic component 10d according to a fifth preferred embodiment will be described with reference to FIG. 8.

Figure 8:
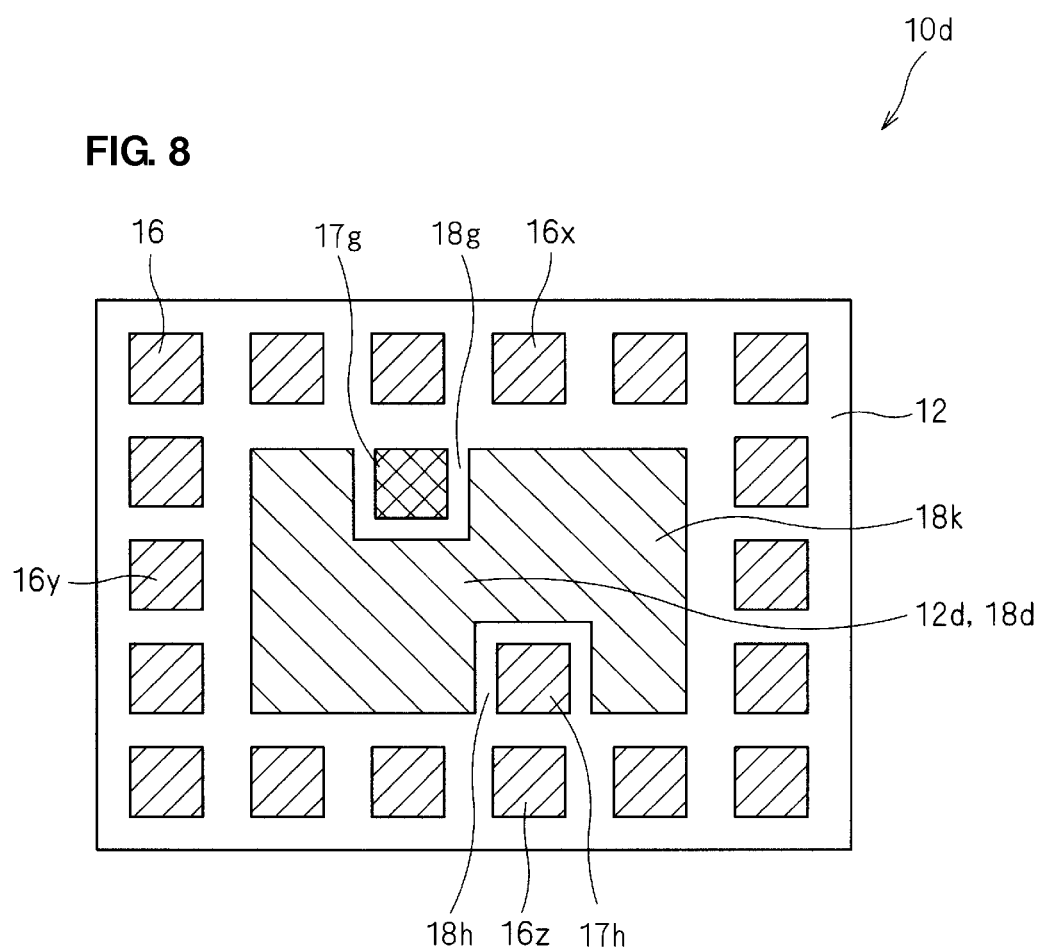
FIG. 8 is a bottom surface view of an electronic component according to a fifth preferred embodiment of the present invention.
Figure 9:
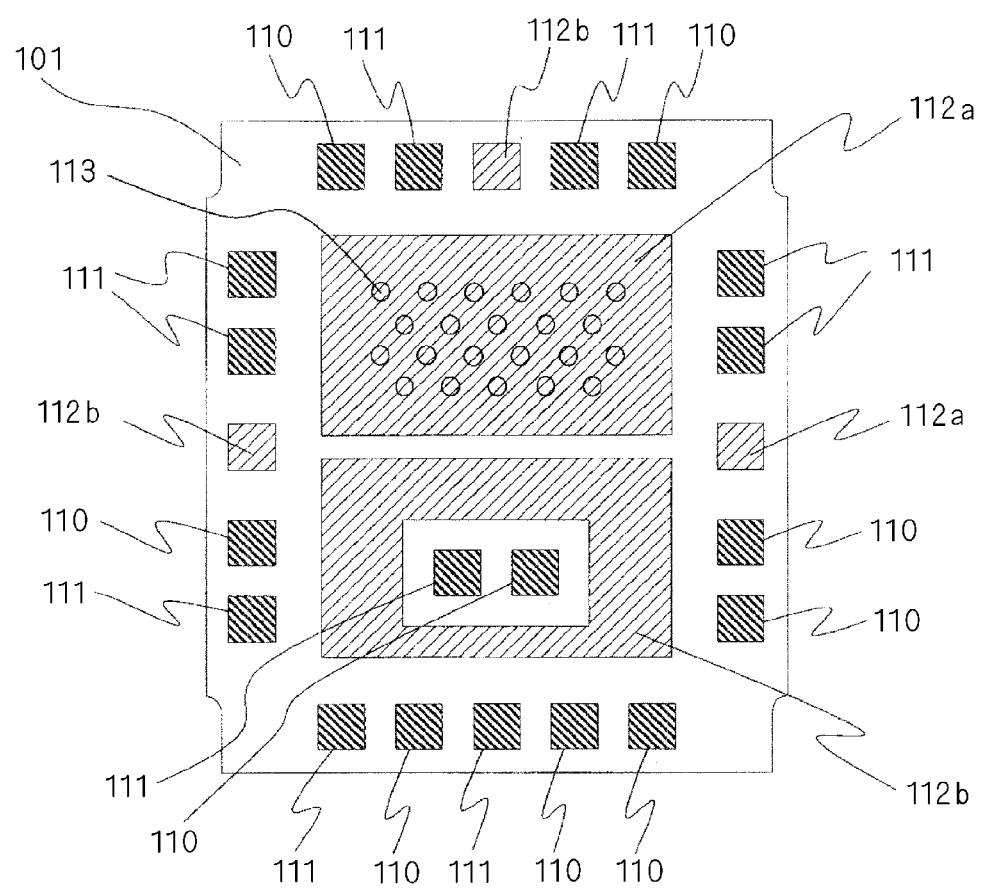
FIG. 9 is a bottom surface view of an electronic component according to a comparative example.

FIG. 8 is a bottom surface diagram of the electronic component 10d. Referring to FIG. 8, in the electronic component 10d of the fifth preferred embodiment, the first terminals 16 are located on the peripheral portion of the bottom surface 12t of the substrate 12, and a ground electrode 18k is located in the center of the bottom surface 12t of the substrate 12, similarly to the first preferred embodiment.

The first terminals 16 are signal terminals through which signals are input or output, except for some of them, i.e., the first terminals 16x, 16y, and 16z. The first terminals 16x, 16y, and 16z are ground terminals to be grounded.

Unlike the first preferred embodiment, the electronic component 10d of the fifth preferred embodiment includes two cut out portions 18g and 18h disposed in the ground electrode 18k, and second terminals 17g and 17h are disposed respectively in the cut out portions 18g and 18h, i.e., a single terminal per cut out portion.

The second terminals 17g and 17h are arranged at positions that are point symmetrical about a center 18d of the ground electrode 18k. The cross-hatched second terminal 17g is an isolated terminal. The other second terminal 17h is a signal terminal. The other second terminal 17h is connected to a circuit element mounted on the top surface of the substrate 12 through a via conductor similarly to the first preferred embodiment, although not illustrated.

When the electronic component 10d is a switch module, a Bluetooth module, or a wireless LAN module mounted in a cellular phone, the signal terminal of a semiconductor device (switch IC or RF-IC) mounted on the substrate 12 as the circuit element 4 is connected to the second terminal 17h through a via conductor. In this case, by particularly connecting an antenna terminal (transmission/reception shared terminal) or a transmission terminal, to which a high-power signal is input during transmission, to the second terminal 17h surrounded by the ground electrode 18k, interference with other terminals due to that signal is prevented, and isolation between a terminal used for transmission and a terminal used for reception is increased.

The center 18d of the ground electrode 18k can be made not to be the same as a center 12d of the bottom surface 12t of the substrate 12. However, when the center 18d of the ground electrode 18k is the same as the center 12c of the bottom surface 12t of the substrate 12, the electronic component 10d can be mounted with better balance than when the center 18d of the ground electrode 18k is not the same as the center 12d of the bottom surface 12t of the substrate 12.

Further, the cut out portions 18g and 18h can have shapes that are not point symmetrical about the center 18d of the ground electrode 18k. However, when the cut out portions 18g and 18h have shapes that are point symmetrical about the center 18d of the ground electrode 18k, the electronic component 10d can be mounted with better balance than when the cut out portions 18g and 18h do not have shapes that are point symmetrical about the center 18d of the ground electrode 18k.

As has been described above, an electronic component can be mounted with good balance by providing an opening in a ground electrode located in the center of the bottom surface of a substrate and by disposing second terminals in this opening at positions that are point symmetrical about the center of the ground electrode.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a substrate;
   a plurality of first terminals located on a peripheral portion of one main surface of the substrate;
   a ground electrode located in a center of the one main surface of the substrate and including an opening; and
   at least two second terminals located on the one main surface of the substrate and within the opening of the ground electrode and that are electrically isolated from the ground electrode; wherein
   the at least two second terminals are arranged at positions that are point symmetrical about a center of the ground electrode;
   all of the plurality of first terminals are disposed directly on the one main surface of the substrate;
   no portion of any of the plurality of first terminals is located closer to the center of the one main surface of the substrate than any portion of the ground electrode; and
   at least one slit is disposed in the ground electrode, such that the at least one slit extends partially but not entirely through the ground electrode.

2. The electronic component according to claim 1, wherein at least one of the second terminals is a signal terminal to which a signal is input, and a circuit element arranged on another main surface of the substrate is connected to the signal terminal through a via conductor extending through the substrate in a vertical direction.

3. The electronic component according to claim 2, wherein the circuit element is an element including a semiconductor substrate and a transmission terminal and/or transmission/reception shared terminal, and the transmission terminal and/or transmission/reception shared terminal of the circuit element is connected to the signal terminal.

4. The electronic component according to claim 1, wherein the opening of the ground electrode includes the center of the ground electrode and a plurality of the second terminal electrodes are arranged within the opening of the ground electrode.

5. The electronic component according to claim 1, wherein areas of all of the at least two second terminals are the same.

6. The electronic component according to claim 1, wherein the center of the ground electrode is the same as a center of the one main surface of the substrate.

7. An electronic component comprising:
   a substrate;
   a plurality of first terminals located on a peripheral portion of one main surface of the substrate;
   a ground electrode located in a center of the one main surface of the substrate and including cut out portions; and
   at least two second terminals located on the one main surface of the substrate and within the cut out portions of the ground electrode and that are electrically isolated from the ground electrode; wherein
   the second terminals are arranged at positions that are point symmetrical about a center of the ground electrode;
   all of the plurality of first terminals are disposed directly on the one main surface of the substrate;
   no portion of any of the plurality of first terminals is located closer to the center of the one main surface of the substrate than any portion of the ground electrode; and
   at least one slit is disposed in the ground electrode, such that the at least one slit extends partially but not entirely through the ground electrode.

8. The electronic component according to claim 7, wherein at least one of the second terminals is a signal terminal to which a signal is input, and a circuit element arranged on another main surface of the substrate is connected to the signal terminal through a via conductor extending through the substrate in a vertical direction.

9. The electronic component according to claim 8, wherein the circuit element is an element including a semiconductor substrate and a transmission terminal and/or transmission/reception shared terminal, and the transmission terminal and/or transmission/reception shared terminal of the circuit element is connected to the signal terminal.

10. The electronic component according to claim 7, wherein areas of all of the at least two second terminals are the same.

11. The electronic component according to claim 7, wherein the center of the ground electrode is the same as a center of the one main surface of the substrate.

* * * * *